US012103559B2

(12) United States Patent
Monteith et al.

(10) Patent No.: US 12,103,559 B2
(45) Date of Patent: Oct. 1, 2024

(54) FILTERING REAL-WORLD OBJECTS FOR INCLUSION IN A SIMULATED ENVIRONMENT

(71) Applicant: GM Cruise Holdings LLC, San Francisco, CA (US)

(72) Inventors: Zachary Monteith, San Francisco, CA (US); Sofya Pugach, San Francisco, CA (US); Hariprasad Govardhanam, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 335 days.

(21) Appl. No.: 17/554,851

(22) Filed: Dec. 17, 2021

(65) Prior Publication Data
US 2023/0192136 A1    Jun. 22, 2023

(51) Int. Cl.
*B60W 60/00* (2020.01)
*B60W 30/095* (2012.01)
(Continued)

(52) U.S. Cl.
CPC ...... *B60W 60/0016* (2020.02); *B60W 30/095* (2013.01); *G06F 30/23* (2020.01);
(Continued)

(58) Field of Classification Search
CPC ...... B60W 10/06; B60W 10/08; B60W 10/11; B60W 20/19; B60W 20/30; B60W 20/40;
(Continued)

(56) References Cited

U.S. PATENT DOCUMENTS 11,938,966 B1 *   3/2024   Besson ............ B60W 30/0956
2020/0174481 A1 *   6/2020   Van Heukelom .. G01C 21/3407
(Continued)

FOREIGN PATENT DOCUMENTS

GB           2606139 A    * 11/2022    ............. G06V 20/58

OTHER PUBLICATIONS

"Scenario-based simulation: combining HD maps and real-world traffic data" published in Medium atlatec Gmbh, Dec. 9, 2020. Downloaded from medium.com/atlatec-gmbh/scenario-based-simulation-combining-hd-maps-and-real-world-traffic-data-adf9dddf086f (Year: 2020).*
(Continued)

*Primary Examiner* — Peter D Nolan
*Assistant Examiner* — Tanya C Sienko

(57) ABSTRACT

The disclosed technology provides solutions for generating synthetic 3D environments. In some aspects, the disclosed technology includes a process of collecting sensor data corresponding with a three-dimensional (3D) space; identifying objects in the sensor data; filtering objects for inclusion in the synthetic map based on (1) a corresponding influence score for each of the one or more of the objects and (2) a corresponding duration of presence of each of the objects in the sensor data; selecting one or more of the objects based on the filtering, wherein the corresponding influence score of each of the one or more of the objects is greater than a first threshold and the corresponding duration of presence of each of the one or more of the objects is greater than a second threshold; and generating the synthetic map including a 3D rendering of the one or more of the objects selected.

20 Claims, 8 Drawing Sheets

(51) Int. Cl.
*G06F 30/23* (2020.01)
*G06V 20/56* (2022.01)
*G06V 20/58* (2022.01)

(52) U.S. Cl.
CPC .......... *G06V 20/582* (2022.01); *G06V 20/588* (2022.01); *B60W 2420/408* (2024.01); *B60W 2554/4041* (2020.02)

(58) Field of Classification Search
CPC ..... B60W 2300/18; B60W 2510/0208; B60W 2510/081; B60W 2510/087; B60W 2510/244; B60W 2520/10; B60W 2710/082; B60W 2710/083; B60W 2720/40; B60W 20/00; B60W 60/0016; B60W 30/095; B60W 2420/408; B60W 2554/4041; B60L 15/20; G06V 20/582; G06V 20/588

See application file for complete search history.

(56) References Cited

U.S. PATENT DOCUMENTS

2021/0309248 A1* 10/2021 Choe .................. G06N 3/04
2022/0119006 A1* 4/2022 Ariyaratne ......... G01C 21/3804

OTHER PUBLICATIONS

"Real-world road and traffic data for simulation: exemplary scenario for IPG CarMaker" YouTube video created Dec. 9, 2019 https://youtu.be/jQzOrHKp7s4?si=zwdlnplYgmY0UhoP (Year: 2019).*

"Detection, Tracking and Prediction using only LiDAR for Autonomous Driving" by Yukihiro Saito (YouTube video https://youtu.be/si9gamz07LA?si=0TL8uqqPT_vVL-hO posted Feb. 1, 2020 (Year: 2020).*

"Deep Predictive Models for Collision Risk Assessment in Autonomous Driving" by M. Strickland et al, https://youtu.be/0TIVE9GLqjs?si=74vPCrOBN54YJKZW presented at ICRA May 21-25, 2018, 2018 (Year: 2018).*

"Edge Case Hunting in Scenario Based Virtual Validation of AVs" by H. Lategahn. YouTube video (25:19) https://youtu.be/XFDa9DG3IA4?si=sX0AMwBIYpeGyzRr Oct. 26, 2020 (Year: 2020).*

"Risk Ranked Recall: Collision Safety Metric for Object Detection Systems in Autonomous Vehicles" by A. Bansal et al;2021 10th Mediterranean Conference on Embedded Computing (MECO), Jun. 7-10, 2021, Budva, Montenegro (Year: 2021).*

* cited by examiner

FILTERING REAL-WORLD OBJECTS FOR INCLUSION IN A SIMULATED ENVIRONMENT

BACKGROUND

1. Technical Field

The subject technology relates to solutions for generating synthetic three-dimensional (3D) environments and in particular, to filtering data collected in real-world to be included in a 3D environment for performing autonomous vehicle (AV) simulations.

2. Introduction

Autonomous vehicles (AVs) are vehicles having computers and control systems that perform driving and navigation tasks that are conventionally performed by a human driver. As AV technologies continue to advance, AVs will be required to perform many of the functions that are conventionally performed by human drivers, such as avoiding dangerous or difficult routes, and performing other navigation and routing tasks necessary to provide safe and efficient transportation. Such tasks may require the collection and processing of large quantities of data using various sensor types, including but not limited to cameras and/or Light Detection and Ranging (LiDAR) sensors disposed on the AV. Additionally, AV maneuvering and navigation functions can be improved through the use of high-definition maps, for example, that can support high accuracy AV localization and sensor validation processes.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. In the drawings:

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

In typical AV localization processes, environmental (sensor) data is collected by the AV for comparison against HD maps, for example, that are generated from high-fidelity sensor data collected by specialized mapping vehicles and pre-stored to the AV. However, because the process of collecting map sensor data and generating real-world HD maps is time consuming, it would be advantageous to utilize synthetic (virtual) three-dimensional (3D) environments in which AV behavior can be accurately simulated. In particular, it would be advantageous to recreate AV behavior in a simulated environment using inputs that are identical to (or nearly identical to) real world data. As discussed in further detail below, the validity of such simulation techniques can be measured by the ability of the AV stack to produce outputs that are identical (or nearly identical) to those that would result if real-world input data was used.

Recreation of AV behavior in a simulated environment can be improved based on data on real-world objects and environment data collected by AVs. Inclusion of every environment object and variations thereof for purposes of recreating every possible scenario in the simulated environment to examine potential AV behavior is computationally cost prohibitive. As discussed in further detail below, the disclosed technology includes a process for filtering real-world sensor data to seed a synthetic environment generation process. Resulting synthetic environments can include synthetic 3D objects/features that are influential to the trajectory and behavior of the AV, e.g., buildings, sidewalks, road signs, objects on the road, pedestrians, etc., that can be used to simulate AV navigation through various map areas.

Figure 1A:
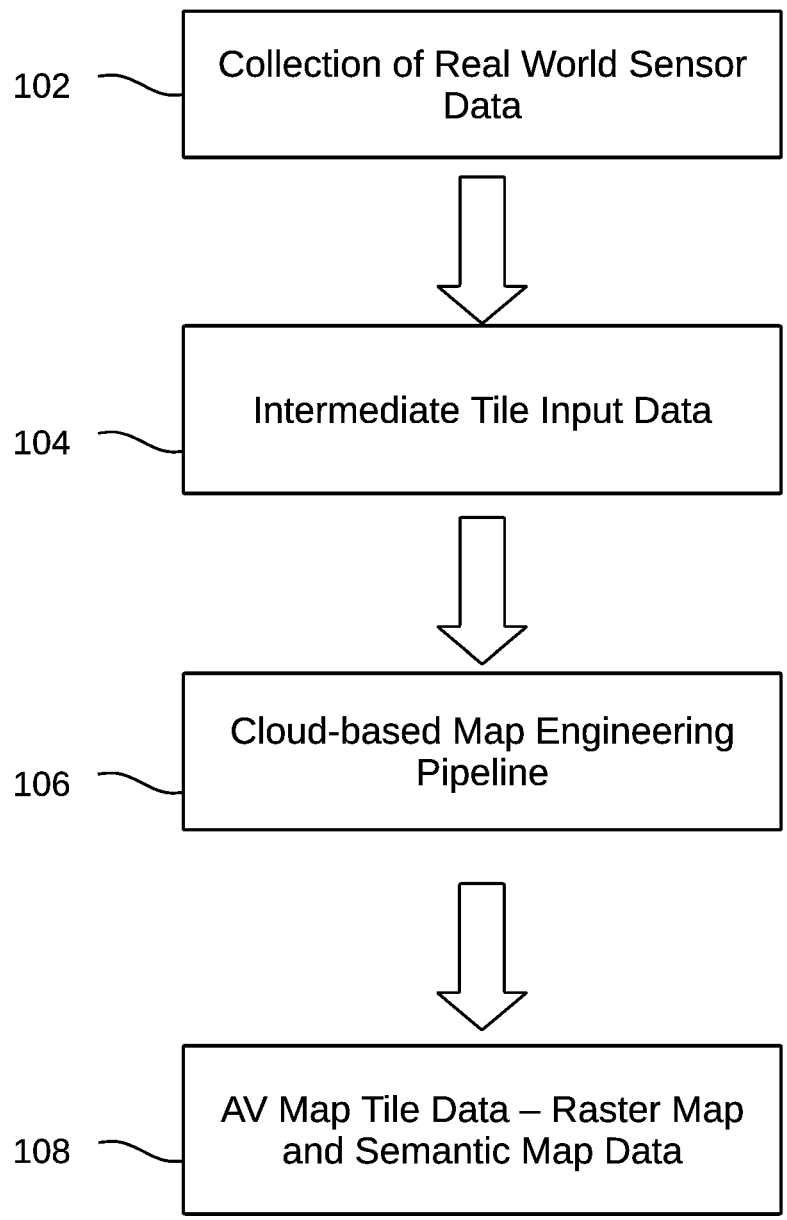
FIG. 1A illustrates a block diagram of example steps for generating high-definition map tile data for a real-world environment, according to some aspects of the disclosed technology.

FIG. 1A illustrates a block diagram of a process 100 for generating high-definition map tile data from a real-world environment. Process 100 begins with block 102 in which real-world sensor data is collected, for example, using a specialized mapping vehicle. The mapping vehicle can be equipped with high-sensitivity sensors configured for collecting environmental data for the environs surrounding the AV. It is understood that various types of sensors may be used, including, but not limited to one or more: Light Detection and Ranging (LiDAR) sensors, cameras, radar systems, Global Positioning System (GPS) devices, and/or accelerometers, etc.

In block 104, the collected sensor data is parsed into a tile format, such as a unified tile render (UTR) format to facilitate downstream processing. Subsequently, at block 106, the map-tiles are processed, for example, to add labels to various map features, such as roadways, traffic signs, traffic boundaries, and other static or semi-static map features. Labeling can be performed manually, for example, by a human administrator or operator. However, in some implementations, automated machine-based labeling can be used, and/or can be implemented to supplement portions of a manual labeling process. By way of example, machine-based labeling can employ machine-learning classification models and/or algorithm-based detectors to identify various map/object features and to supplement the intermediate tile data with semantic labels.

In block 108, map tiles that include a combination of raster map and semantic map data are generated. In application, the map tiles can be downloaded to an AV and used for comparison against collected sensor data, e.g., to perform localization, maneuvering, and/or navigation operations. In such cases, the HD map tile data can be used to validate real-world sensor data collected by the AV sensors, for example, based on an amount (or degree) of agreement between the collected sensor data and the a priori representation of the real-world provided by the map tile data. In some aspects, the map tile data can additionally be used to generate (seed) synthetic (virtual) 3D environments, as discussed in further detail with respect to FIG. 1B.

Figure 1B:
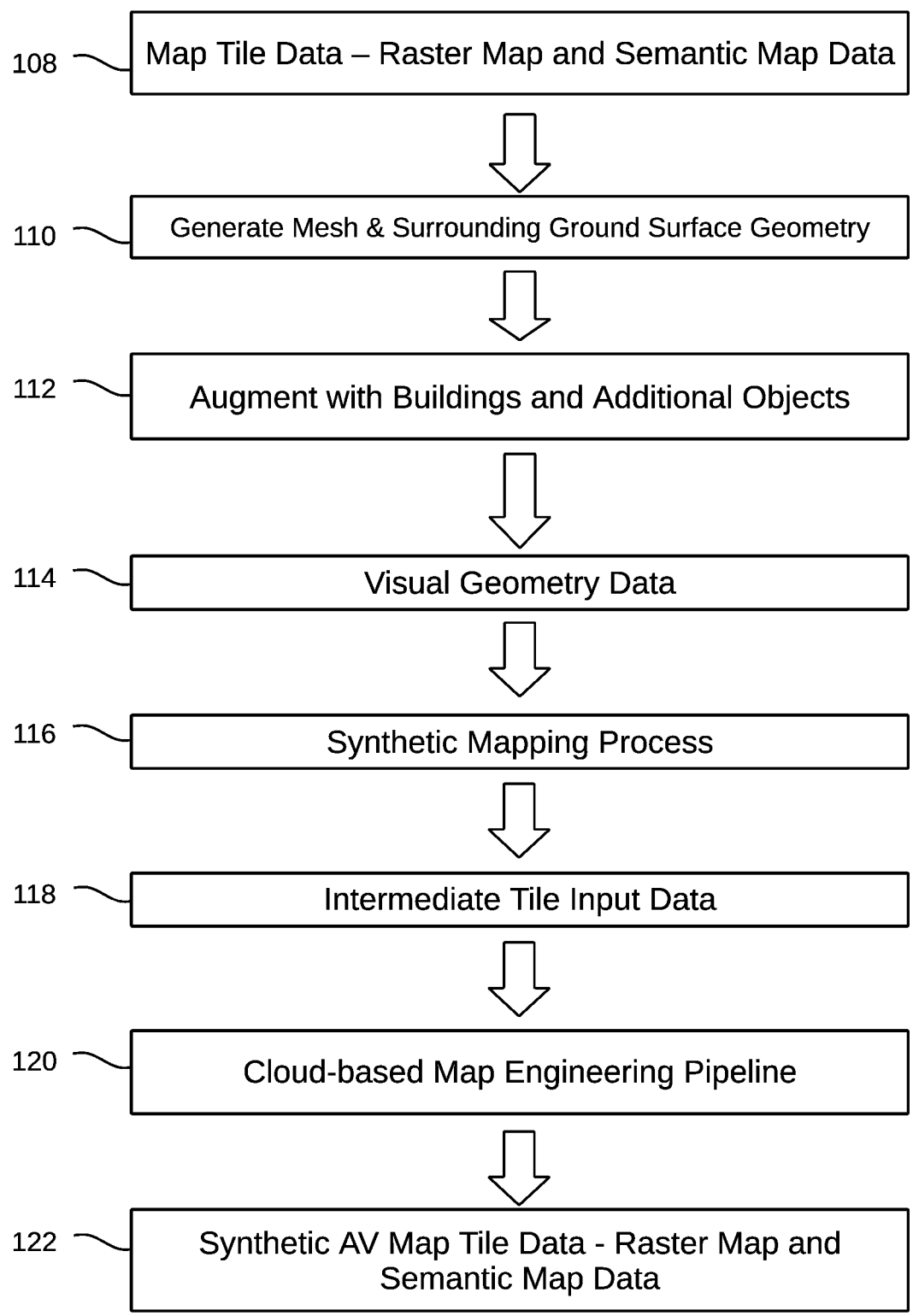
FIG. 1B illustrates a block diagram of example steps for generating high-definition map tile-data for a synthetic environment, according to some aspects of the disclosed technology.

FIG. 1B, illustrates a block diagram of example process 109 for generating high-definition map tile-data for a synthetic (virtual) environment. Process 109 continues from block 108, in which the real-world AV map tile data generated by process 100, is received. The real-world map tile data can be used to supply real-world features, such as roadway and building footprint locations, that can be used to seed the generation of a 3D synthetic environment, for example, that includes synthetic objects, such as buildings, as discussed below.

In block 110, various meshes, including the ground surface geometry is generated. The mesh can identify a basic layout for the synthetic environment, including the locations of features, such as buildings, roadways, intersections, walkable surfaces, and/or other transportation infrastructure, that are based on corresponding features in the real-world map tile data (108).

In block 112, synthetic objects are generated and added to the mesh. The generated synthetic objects can correspond with (or represent) virtually any object that can be detected by an AV sensor in the real-world. In some approaches, the synthetic objects can include any static or semi-static objects, for example, that do not change position/location in a highly dynamic manner. By way of example, the synthetic objects can include, but are not limited to one or more: buildings, traffic signals, light posts, bike stations, trees, stop-signs, etc.

In block 114, visual geometry data is generated to form a 3D synthetic environment. The resulting synthetic environment can represent a 3D virtual space containing entirely novel and continuous synthetic features and objects (e.g., buildings, lamp posts, etc.), while also providing some correspondence to real-world topographic features (e.g., roadways, and building locations/footprints, etc.). The synthetic 3D environment can then be used to generate a synthetic 3D map, for example, using a synthetic mapping process (block 116). Subsequently, the synthetic map can be parsed into intermediate tile data (block 118). Similar to block 104 discussed above in relation to FIG. 1C, the synthetic map tile data (block 118) can represent map data that is stored in a format optimized for consumption by an AV stack. However, in contrast to the map tile data described with respect to block 104, the intermediate (synthetic) (118) map tile data contains representations of synthetic objects from the synthetic environment.

Subsequently, at block 120, a (self-serve) cloud-based engineering pipeline is used to add labels to those features of the synthetic environment that have correspondence to real-world features/objects. In some implementations, existing semantic labels can be copied or re-used for corresponding features in the synthetic map. In this manner, the synthetic 3D map data can be enriched with semantic label information without the need to repeat the labeling process, which can be expensive and time-consuming. As such, the resulting synthetic AV map tile data (block 122) can include map tiles for a synthetic map generated from a synthetic environment, while also being complete with semantic labels for certain features (e.g., intersections, roadways, building locations), that have real-world correspondence.

Figure 1C:
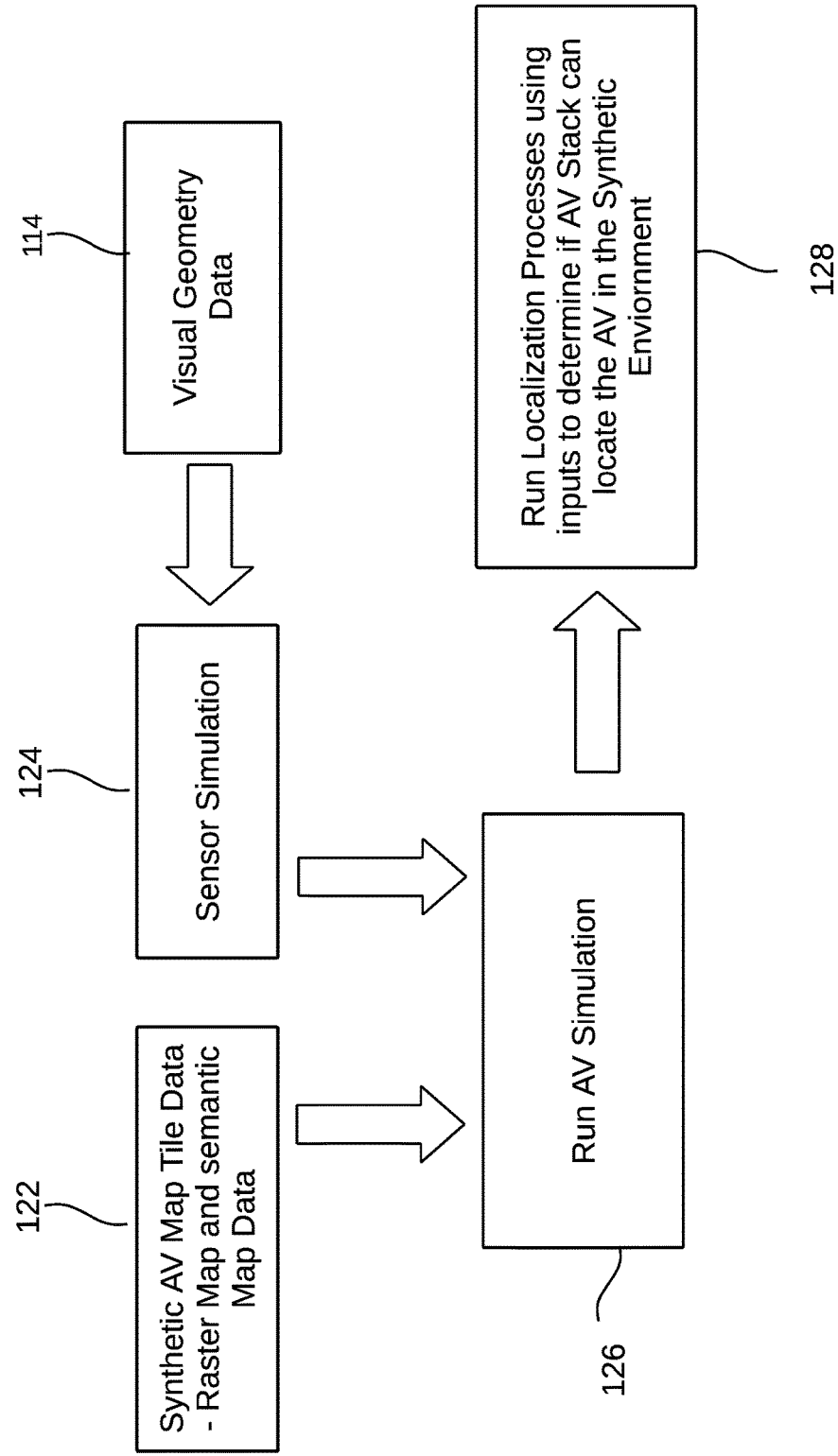
FIG. 1C illustrates a block diagram of an example process for running an AV simulation using a 3D synthetic environment, according to some aspects of the disclosed technology.

FIG. 1C illustrates a block diagram of an example process 121 for running an AV simulation. As illustrated by process 121, visual geometry data representing the synthetic 3D environment (114) is provided to one or more simulated AV sensors (124), for example, to simulation AV navigation within the 3D synthetic environment (126). Additionally, AV map tile data (122) is provided to the AV simulation (122). As such, synthetic sensor data collected from the sensor simulation process (124) can be used for comparison with the synthetic map tile data (122), for example, to facilitate the simulation of various AV processes. By way of example, the synthetic sensor data can be used to measure AV localization stack convergence in the synthetic environment (128).

Figure 2:
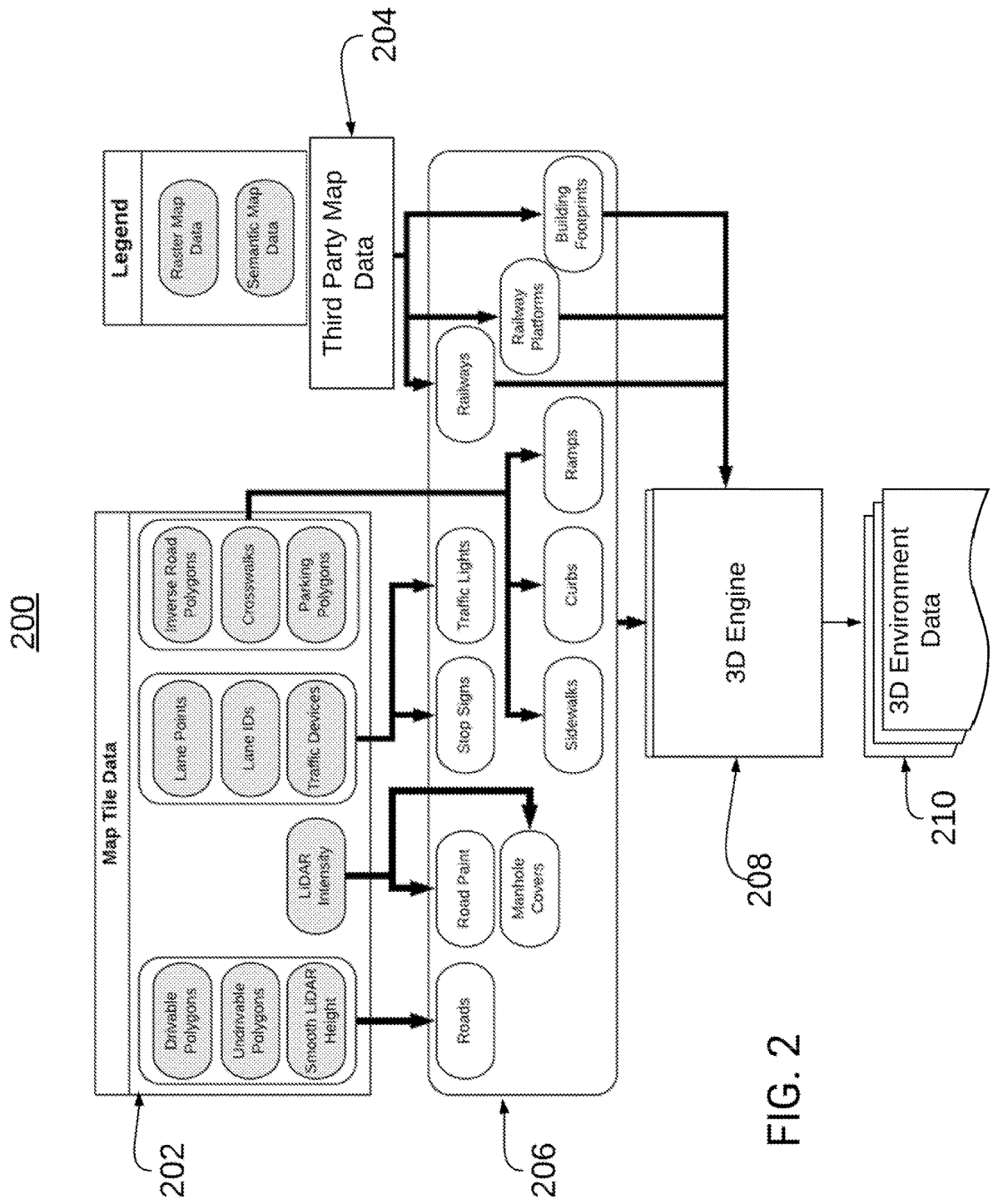
FIG. 2 illustrates a conceptual block diagram of an example system 200 for generating a synthetic environment.

FIG. 2 illustrates a conceptual block diagram of an example system 200 for generating a synthetic environment. System 200 includes various types of real-world data, e.g., map tile data 202 and third-party map data 204 that can be used to seed generation of various synthetic geometries and objects. Although the example of system 200 includes map tile data 202 and third-party map data 204, it is understood that different (or additional) types of real-world data may be used to seed generation of various synthetic environment components, without departing from the scope of the disclosed technology.

In the example of system 200, map tile data 202 can include real-world sensor data (e.g., recorded using one or more AV sensors), as well as ground-truth data (e.g., polygons and/or semantic labels), for example, that are provided by a manual labeling or tagging process. As illustrated, map tile data 202 includes drivable polygons (representing drivable roadway surfaces), undrivable polygons (representing undrivable surfaces), and LiDAR height data (indicating elevation parameters for various map surfaces). Map tile data 202 can also include LiDAR intensity data that indicates LiDAR return intensities for different features, including roadway paint, and/or manhole coverings, etc. In some aspects, map tile data 202 can include collected sensor data and semantic labels (e.g., lane points, lane IDs, traffic devices) that can define traffic control objects, such as roadway signage and/or traffic lights. Additionally, map tile data 202 can include polygons defining certain non-roadway surfaces, e.g., inverse road polygons, crosswalks, parking polygons, etc. In some aspects, third-party map data 204 can be used to provide real-world (ground truth) inputs for significant features, such as transportation structures, e.g., railways, railway platforms, and/or other large objects, e.g., buildings, etc.

The real-world seed data (e.g., map tile data 202, and third-party map data 204) are then used to create synthetic geometries for use in generating a synthetic 3D map. In the example of system 200, unreal (synthetic) import meshes derived from map tile data 202 can represent features for synthetic driving surfaces (e.g., roads, road paint, manhole covers), as well as locations of traffic control objects (road signs, traffic lights) and/or non-roadway surfaces (e.g., sidewalks, curbs, ramps, etc.). Synthetic import meshes for other features may be derived from third-party map data 204, including, for example, railways, railway platforms, and/or building footprints etc.

After synthetic object meshes have been created, the meshes and other object data can be assembled/collated (206) and imported into a 3D engine (208) to generate corresponding synthetic objects, e.g., buildings and other structures. Synthetic objects can include but are not limited to street lights, railway racks, railway platforms, and buildings. It is understood that the synthetic mesh geometries and synthetic objects described above are provided as examples, and that different geometries and/or objects can be generated, without departing from the scope of the disclosed technology.

By integrating synthetic meshes and associated synthetic objects, full 3D synthetic environments can be generated, e.g., as represented by the outputted environment data 210. As discussed above, the resulting 3D synthetic environments can be used for AV simulations. For example, AV navigation and data collection through various portions of a synthetic 3D environment can be used to facilitate localization and sensor calibration processes.

What has been described above with reference to FIGS. 1A-C and 2 are example processes and systems for generating synthetic 3D environments for running AV simulations. When creating the synthetic 3D environment using real-world environmental data collected using sensors, as described above with reference to FIG. 1A, a program (e.g., Bag2Yaml) may be executed to faithfully reproduce all tracked objects (e.g., by an AV that collected the real-world environment data). Reproducing all tracked objects entails the following. First, any and all noise in tracked objects will be preserved when synthetically reproduced. The noise can include, but is not limited to, false positive detections, false negative (in which a detected object is dropped for an entity at one instance (e.g., at a tick defined as ⅒th of a second) but then assigned a new track_id at a next instance), duplicate tracks, associating sensor data for two different objects into one or improperly segmenting data from one object into two, etc. Second, not every real-world object included in the environment data is important to the trajectory of the AV. Accordingly, faithfully recreating every object detected in the real-world would be computationally expensive.

Figure 3:
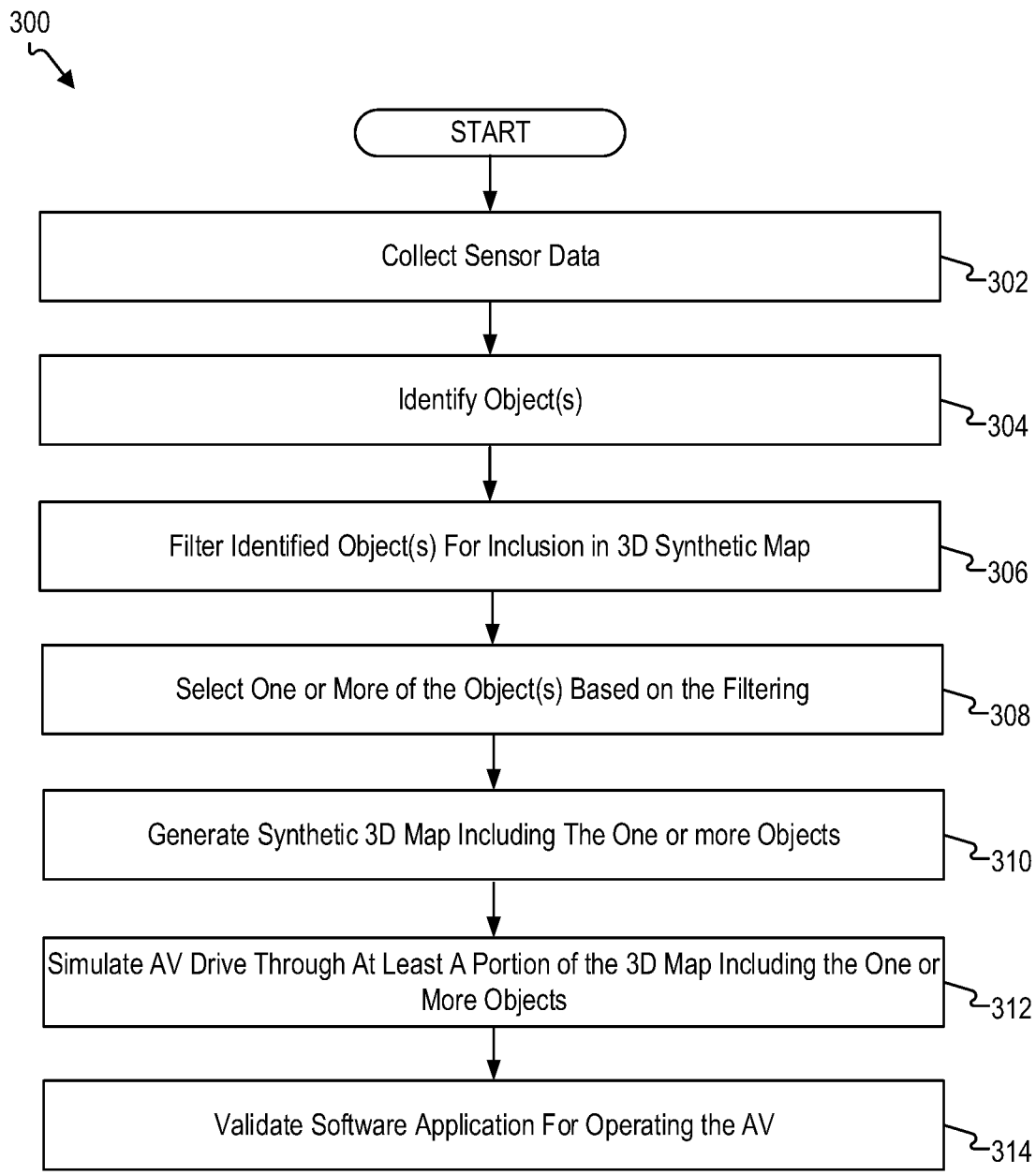
FIG. 3 illustrates steps of an example process of filtering real-world objects for inclusion in the 3D synthetic environment for running an AV simulation, according to some aspects of the disclosed technology.

FIG. 3 illustrates steps of an example process of filtering real-world objects for inclusion in the 3D synthetic environment for running an AV simulation, according to some aspects of the disclosed technology.

According to method 300, at step 302, sensor data is collected. This sensor data may also be referred to as environmental data or simply bag data. As described above, sensor data can be collected using various types of known or to be developed sensors mounted on a vehicle driving through a neighborhood, a city, etc. Sensors and examples thereof will be described in more detail below with reference to FIG. 4

Sensor data collected at step 302 correspond to any object observed by sensors on an AV. Accordingly, each detected object may have a corresponding track_id that identifies the object among the collected sensor data and a corresponding set of attention score. In one example, attention score is a matrix of variables one of which is referred to as an influence score. An influence score for an object at any given point in time may be indicative of the likelihood of the object interfering with the trajectory of an AV or influencing the trajectory of an AV at the present time or in the near future (within a next couple of ticks, with a tick defined as ⅒th of a second). For example, a pedestrian that is observed in a sidewalk walking toward an intersection that an AV is approaching, may have an influence score that indicates it is unlikely to influence the AV at time 0 since the pedestrian is on the sidewalk. However, 30 seconds later, the same pedestrian may be observed to cross the intersection and thus may be assigned a higher influence score as it is more likely to cause a change in the trajectory of the AV at that time (e.g., either bringing the AV to a stop or causing it to change lanes, etc.). In some examples, the numerical value for an influence score for a given object may be inversely proportional to a probability of that object interfering with a trajectory of an AV. For example, an entity (e.g., an object) with an influence score of 0 may have a 100% likelihood of influencing the AV trajectory while an entity (e.g., an object) with a high numerical value (e.g., a numerical value of 200+) would have a very small likelihood of influencing the AV trajectory. In some examples, the influence score for a given object may be directly proportional to a probability of that object interfering with a trajectory of an AV. In this instance, an entity (e.g., an object) with an influence score of 0 may have a near zero likelihood of influencing the AV trajectory while an entity (e.g., an object) with a high numerical value (e.g., a numerical value of 200+) would have a very high likelihood of influencing the AV trajectory (close to 100%).

In some examples, an influence score may be a scale having a minimum and maximum value, with the minimum value indicating that the corresponding object has the lowest possible influence on the trajectory of the AV that is observing the object and the maximum value indicating that the corresponding object has the highest possible influence on the trajectory of the AV. In one example, the influence score scale may be presented in increments of 5 with 10 being the minimum value and 30 being the maximum value (scale of 10 to 30). In some examples, a cutoff (a threshold) for an influence score may be determined and may take on values ranging between 10 and 30. In this instance, entities with a score below the threshold may be included in a simulation, while those with values above the threshold may not (or vice-versa). An influence score may have values as low as 0 (e.g., with a 100% likelihood of influencing a trajectory of an AV) without an upper bound. Alternatively, influence scores can have high upper bounds (e.g., 300 or above), representing entities that are highly unlikely to influence an AV's trajectory.

In some examples, the influence score may be determined on the AV and as the real-world data is collected by sensors mounted on the AV. For example, a software controlling the operation of the AV may take factors such as speed, distance, direction of movement, and/or an acceleration of a nearby object to determine its current location and future trajectory (e.g., over the next few tenth of a second). Based on the current location and the future trajectory, the software can assign an influence score to the corresponding object detected.

In some examples, the software running on the AV may utilize any known or to be developed trained machine learning model to assign an influence score to each detected object. Such models may have been trained to receive as input a detected object and associated parameters including, but not limited to, the type of object, direction of movement of the object, speed and/or acceleration of the object. The trained model will then output an influence score for that detected object. An example neural network will be described below with reference to FIG. 6.

At step 304, objects in the sensor data collected at step 302 are identified. In one example, objects may be identified using their associated track_id described above.

At step 306, objects identified at step 304 are filtered for inclusion in the synthetic map based on (1) a corresponding influence score for each of the one or more of the objects and (2) a corresponding duration of presence of each of the objects in the sensor data. For example, for each object, a determination may be made as to whether a corresponding influence score available for that object is equal to or greater (or simply greater) than a threshold (a first threshold). Also, as mentioned above, each object has a track_id in the sensor data. A determination is also made as to whether the track_id is detected and included in the sensor data (has a duration of presence) for more than a threshold time (e.g., for at least ten ticks or 1 second). This threshold time may be referred to as a second threshold. In one example, the first threshold and/or the second threshold may be configurable parameters that may be determined based on experiments and/or empirical studies. For example, a test of varying degrees of first thresholds and second thresholds may be executed and a determination may be made as to what combination of first and second thresholds results in a minimum positional error and/or alternatively has the highest reproducibility acceptance criteria.

At step 308 and based on the filtering at step 306, one or more of the objects are selected for inclusion in the 3D synthetic map to be generated as described above with reference to FIGS. 1A-C and 2. For example, any identified object with a corresponding influence score that is equal to and/or greater than the first threshold and has a duration of presence that is equal to and/or greater than the second threshold may be selected for inclusion in the generated 3D synthetic map. Alternatively, any object with a corresponding influence score that is equal to and/or greater than the first threshold may be selected for inclusion in the generated 3D synthetic map. In another example, any object with a corresponding duration of presence that is equal to and/or greater than the second threshold may be selected for inclusion in the generated 3D synthetic map.

At step 310, the synthetic map is generated including a 3D rendering of the one or more of the objects selected. The process at step 310 may be performed as described above with reference to FIGS. 1A-C and 2.

At step 312, a drive of an autonomous vehicle (AV) through at least a portion the synthetic map is simulated, the portion of the map including the one or more of the objects. The process at step 312 may be performed as described above with reference to FIGS. 1A-C and 2.

At step 314, a software application developed for operating the AV is validated based on results of simulating the drive of the AV in a synthetic environment including the selected objects. Being able to operate in an empty road (where no other drivers, pedestrians or road users are present) does not provide much signal as to how well the software controlling the operation of an AV is operating, as this represents the easiest possible driving conditions. On the other hand, creating a simulation scenario in which every entity (e.g., object) that was observed in the real world is rendered does provide greater signal (does the car properly respond to those entities, yielding when appropriate, avoiding collisions at all times, etc.), but can be computationally expensive. According to aspects of the present disclosure described herein, filtering and only including the most influential entities (e.g., based on influence scores), however, represents significant cost reduction compared to rendering all entities and at the same time, can provide adequate signal on the AV software's ability to respond to other entities. Therefore, at step 314, the operation of the software operating the AV is validated (e.g., how the AV operates) based on simulations in which most influential entities are included.

In one example, the steps of FIG. 3 described above may be performed at data center 450 and more specifically by simulation platform 456, which will be further described below with reference to FIG. 4.

Figure 4:
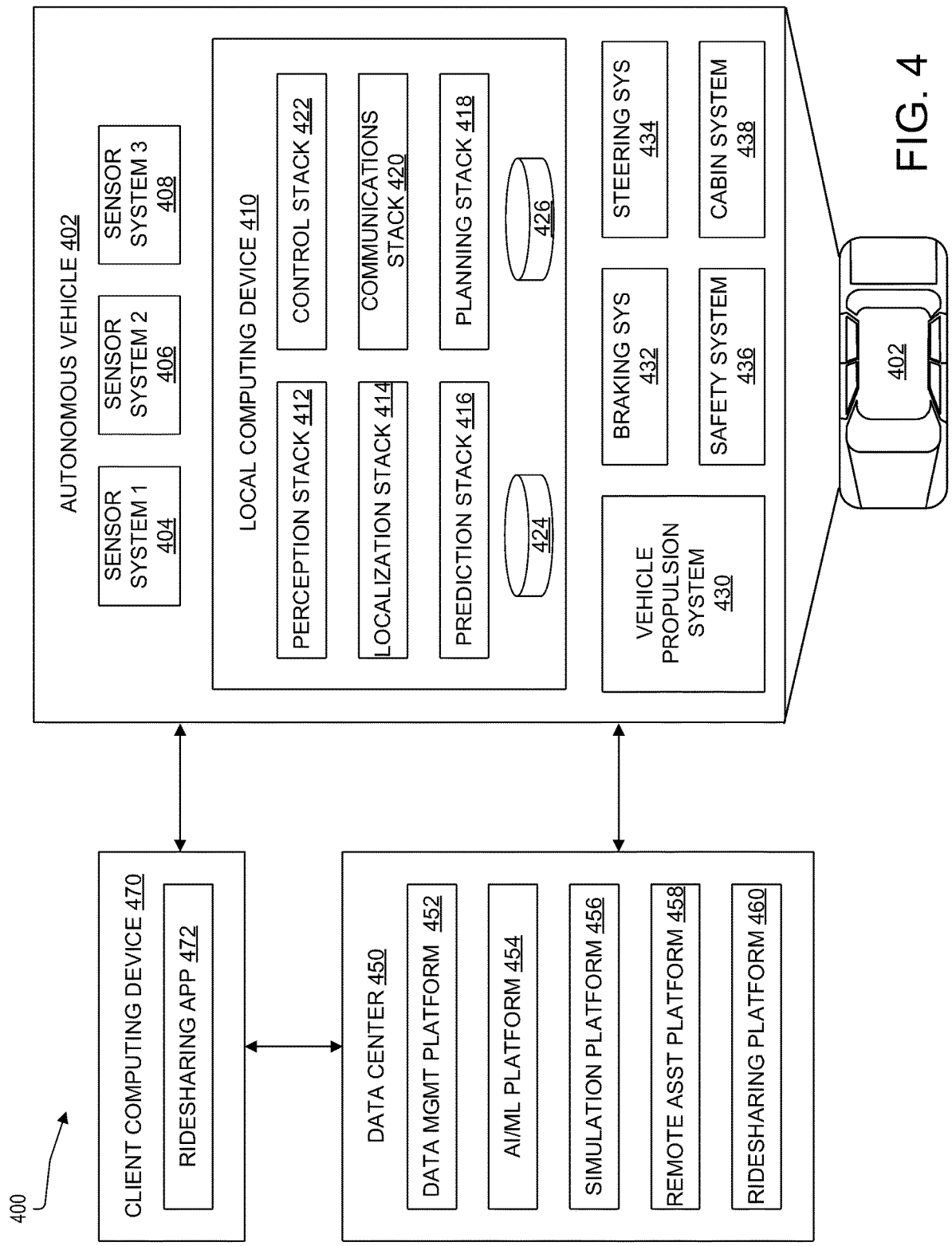
FIG. 4 illustrates an example of a system for managing one or more Autonomous Vehicles (AVs) in accordance with some aspects of the present technology.

Turning now to FIG. 4 illustrates an example of an AV management system 400. One of ordinary skill in the art will understand that, for the AV management system 400 and any system discussed in the present disclosure, there can be additional or fewer components in similar or alternative configurations. The illustrations and examples provided in the present disclosure are for conciseness and clarity. Other embodiments may include different numbers and/or types of elements, but one of ordinary skill the art will appreciate that such variations do not depart from the scope of the present disclosure.

In this example, the AV management system 400 includes an AV 402, a data center 450, and a client computing device 470. The AV 402, the data center 450, and the client computing device 470 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 402 can navigate roadways without a human driver based on sensor signals generated by multiple sensor systems 404, 406, and 408. The sensor systems 404-408 can include different types of sensors and can be arranged about the AV 402. For instance, the sensor systems 404-408 can comprise Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 404 can be a camera system, the sensor system 406 can be a LIDAR system, and the sensor system 408 can be a RADAR system. Other embodiments may include any other number and type of sensors.

The AV 402 can also include several mechanical systems that can be used to maneuver or operate the AV 402. For instance, the mechanical systems can include a vehicle propulsion system 430, a braking system 432, a steering system 434, a safety system 436, and a cabin system 438, among other systems. The vehicle propulsion system 430 can include an electric motor, an internal combustion engine, or both. The braking system 432 can include an engine brake, brake pads, actuators, and/or any other suitable componentry configured to assist in decelerating the AV 402. The steering system 434 can include suitable componentry configured to control the direction of movement of the AV 402 during navigation. The safety system 436 can include lights and signal indicators, a parking brake, airbags, and so forth. The cabin system 438 can include cabin temperature control systems, in-cabin entertainment systems, and so forth. In some embodiments, the AV 402 might not include human driver actuators (e.g., steering wheel, handbrake, foot brake pedal, foot accelerator pedal, turn signal lever, window wipers, etc.) for controlling the AV 402. Instead, the cabin system 438 can include one or more client interfaces (e.g., Graphical User Interfaces (GUIs), Voice User Interfaces (VUIs), etc.) for controlling certain aspects of the mechanical systems 430-438.

The AV 402 can additionally include a local computing device 410 that is in communication with the sensor systems 404-408, the mechanical systems 430-438, the data center 450, and the client computing device 470, among other systems. The local computing device 410 can include one or more processors and memory, including instructions that can be executed by the one or more processors. The instructions can make up one or more software stacks or components responsible for controlling the AV 402; communicating with the data center 450, the client computing device 470, and other systems; receiving inputs from riders, passengers, and other entities within the AV's environment; logging metrics collected by the sensor systems 404-408; and so forth. In this example, the local computing device 410 includes a perception stack 412, a mapping and localization stack 414, a prediction stack 416, a planning stack 418, a communications stack 420, a control stack 422, an AV operational database 424, and an HD geospatial database 426, among other stacks and systems.

The perception stack 412 can enable the AV 402 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 404-408, the mapping and localization stack 414, the HD geospatial database 426, other components of the AV, and other data sources (e.g., the data center 450, the client computing device 470, third party data sources, etc.). The perception stack 412 can detect and classify objects and determine their current locations, speeds, directions, and the like. In addition, the perception stack 412 can determine the free space around the AV 402 (e.g., to maintain a safe distance from other objects, change lanes, park the AV, etc.). The perception stack 412 can also identify environmental uncertainties, such as where to look for moving objects, flag areas that may be obscured or blocked from view, and so forth. In some embodiments, an output of the prediction stack can be a bounding area around a perceived object that can be associated with a semantic label that identifies the type of object that is within the bounding area, the kinematic of the object (information about its movement), a tracked path of the object, and a description of the pose of the object (its orientation or heading, etc.).

The mapping and localization stack 414 can determine the AV's position and orientation (pose) using different methods from multiple systems (e.g., GPS, IMUs, cameras, LIDAR, RADAR, ultrasonic sensors, the HD geospatial database 426, etc.). For example, in some embodiments, the AV 402 can compare sensor data captured in real-time by the sensor systems 404-408 to data in the HD geospatial database 426 to determine its precise (e.g., accurate to the order of a few centimeters or less) position and orientation. The AV 402 can focus its search based on sensor data from one or more first sensor systems (e.g., GPS) by matching sensor data from one or more second sensor systems (e.g., LIDAR). If the mapping and localization information from one system is unavailable, the AV 402 can use mapping and localization information from a redundant system and/or from remote data sources.

The prediction stack 416 can receive information from the localization stack 414 and objects identified by the perception stack 412 and predict a future path for the objects. In some embodiments, the prediction stack 416 can output several likely paths that an object is predicted to take along with a probability associated with each path. For each predicted path, the prediction stack 416 can also output a range of points along the path corresponding to a predicted location of the object along the path at future time intervals along with an expected error value for each of the points that indicates a probabilistic deviation from that point.

The planning stack 418 can determine how to maneuver or operate the AV 402 safely and efficiently in its environment. For example, the planning stack 418 can receive the location, speed, and direction of the AV 402, geospatial data, data regarding objects sharing the road with the AV 402 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 402 from one point to another and outputs from the perception stack 412, localization stack 414, and prediction stack 416. The planning stack 418 can determine multiple sets of one or more mechanical operations that the AV 402 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 418 can select from multiple backup plans to carry out. For example, while preparing to change lanes to turn right at an intersection, another vehicle may aggressively cut into the destination lane, making the lane change unsafe. The planning stack 418 could have already determined an alternative plan for such an event. Upon its occurrence, it could help direct the AV 402 to go around the block instead of blocking a current lane while waiting for an opening to change lanes.

The control stack 422 can manage the operation of the vehicle propulsion system 430, the braking system 432, the steering system 434, the safety system 436, and the cabin system 438. The control stack 422 can receive sensor signals from the sensor systems 404-408 as well as communicate with other stacks or components of the local computing device 410 or a remote system (e.g., the data center 450) to effectuate operation of the AV 402. For example, the control stack 422 can implement the final path or actions from the multiple paths or actions provided by the planning stack 418. This can involve turning the routes and decisions from the planning stack 418 into commands for the actuators that control the AV's steering, throttle, brake, and drive unit.

The communications stack 420 can transmit and receive signals between the various stacks and other components of the AV 402 and between the AV 402, the data center 450, the client computing device 470, and other remote systems. The communications stack 420 can enable the local computing device 410 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communications stack 420 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 426 can store HD maps and related data of the streets upon which the AV 402 travels. In some embodiments, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls layer can include geospatial information of traffic signal lights, traffic signs, and other road objects and related attributes.

The AV operational database 424 can store raw AV data generated by the sensor systems 404-408, stacks 412-422, and other components of the AV 402 and/or data received by the AV 402 from remote systems (e.g., the data center 450, the client computing device 470, etc.). In some embodiments, the raw AV data can include HD LIDAR point cloud data, image data, RADAR data, GPS data, and other sensor data that the data center 450 can use for creating or updating AV geospatial data or for creating simulations of situations encountered by AV 402 for future testing or training of various machine learning algorithms that are incorporated in the local computing device 410.

The data center 450 can be a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and so forth. The data center 450 can include one or more computing devices remote to the local computing device 410 for managing a fleet of AVs and AV-related services. For example, in addition to managing the AV 402, the data center 450 may also support a ridesharing service, a delivery service, a remote/roadside assistance service, street services (e.g., street mapping, street patrol, street cleaning, street metering, parking reservation, etc.), and the like.

The data center 450 can send and receive various signals to and from the AV 402 and the client computing device 470. These signals can include sensor data captured by the sensor systems 404-408, roadside assistance requests, software updates, ridesharing pick-up and drop-off instructions, and so forth. In this example, the data center 450 includes a data management platform 452, an Artificial Intelligence/Machine Learning (AI/ML) platform 454, a simulation platform 456, a remote assistance platform 458, and a ridesharing platform 460, among other systems.

The data management platform 452 can be a "big data" system capable of receiving and transmitting data at high velocities (e.g., near real-time or real-time), processing a large variety of data and storing large volumes of data (e.g., terabytes, petabytes, or more of data). The varieties of data can include data having different structured (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 450 can access data stored by the data management platform 452 to provide their respective services.

The AI/ML platform 454 can provide the infrastructure for training and evaluating machine learning algorithms for operating the AV 402, the simulation platform 456, the remote assistance platform 458, the ridesharing platform 460, and other platforms and systems. Using the AI/ML platform 454, data scientists can prepare data sets from the data management platform 452; select, design, and train machine learning models; evaluate, refine, and deploy the models; maintain, monitor, and retrain the models; and so on.

The simulation platform 456 can enable testing and validation of the algorithms, machine learning models, neural networks, and other development efforts for the AV 402, the remote assistance platform 458, the ridesharing platform 460, and other platforms and systems. The simulation platform 456 can replicate a variety of driving environments and/or reproduce real-world scenarios from data captured by the AV 402, including rendering geospatial information and road infrastructure (e.g., streets, lanes, crosswalks, traffic lights, stop signs, etc.) obtained from a cartography platform; modeling the behavior of other vehicles, bicycles, pedestrians, and other dynamic elements; simulating inclement weather conditions, different traffic scenarios; and so on.

The remote assistance platform 458 can generate and transmit instructions regarding the operation of the AV 402. For example, in response to an output of the AI/ML platform 454 or other system of the data center 450, the remote assistance platform 458 can prepare instructions for one or more stacks or other components of the AV 402.

The ridesharing platform 460 can interact with a customer of a ridesharing service via a ridesharing application 472 executing on the client computing device 470. The client computing device 470 can be any type of computing system, including a server, desktop computer, laptop, tablet, smartphone, smart wearable device (e.g., smartwatch, smart eyeglasses or other Head-Mounted Display (HMD), smart ear pods, or other smart in-ear, on-ear, or over-ear device, etc.), gaming system, or other general purpose computing device for accessing the ridesharing application 472. The client computing device 470 can be a customer's mobile computing device or a computing device integrated with the AV 402 (e.g., the local computing device 410). The ridesharing platform 460 can receive requests to pick up or drop off from the ridesharing application 472 and dispatch the AV 402 for the trip.

Figure 5:
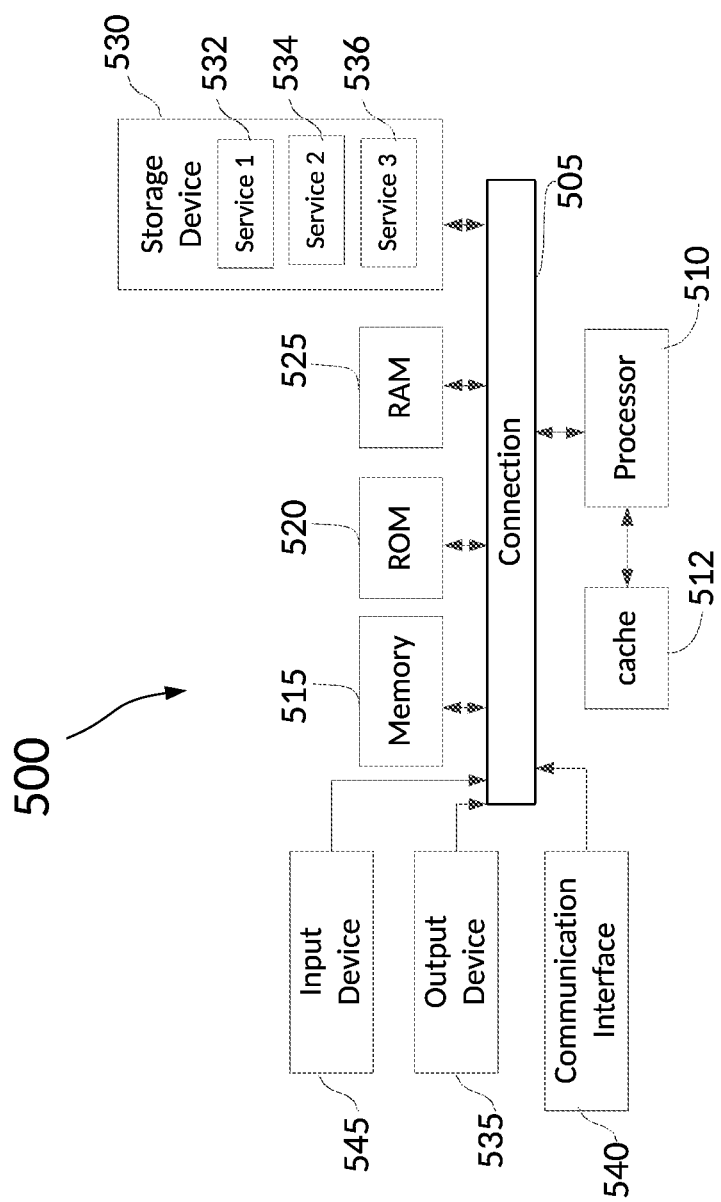
FIG. 5 illustrates an example processor-based system with which some aspects of the subject technology can be implemented.

FIG. 5 illustrates an example processor-based system with which some aspects of the subject technology can be implemented. For example, processor-based system 500 can be any computing device making up internal computing system 510, a remote computing system such as data center 450 a passenger device executing the rideshare app 472, internal computing device 530, or any component thereof in which the components of the system are in communication with each other using connection 505. Connection 505 can be a physical connection via a bus, or a direct connection into processor 510, such as in a chipset architecture. Connection 505 can also be a virtual connection, networked connection, or logical connection.

In some examples, computing system 500 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 500 includes at least one processing unit (CPU or processor) 510 and connection 505 that couples various system components including system memory 515, such as read-only memory (ROM) 520 and random access memory (RAM) 525 to processor 510. Computing system 500 can include a cache of high-speed memory 512 connected directly with, in close proximity to, or integrated as part of processor 510.

Processor 510 can include any general purpose processor and a hardware service or software service, such as services 532, 534, and 536 stored in storage device 530, configured to control processor 510 as well as a special-purpose processor where software instructions are incorporated into the actual processor design. Processor 510 may essentially be a completely self-contained computing system, containing multiple cores or processors, a bus, memory controller, cache, etc. A multi-core processor may be symmetric or asymmetric.

To enable user interaction, computing system 500 includes an input device 545, which can represent any number of input mechanisms, such as a microphone for speech, a touch-sensitive screen for gesture or graphical input, keyboard, mouse, motion input, speech, etc. Computing system 500 can also include output device 535, which can be one or more of a number of output mechanisms known to those of skill in the art. In some instances, multimodal systems can enable a user to provide multiple types of input/output to communicate with computing system 500. Computing system 500 can include communications interface 540, which can generally govern and manage the user input and system output. The communication interface may perform or facilitate receipt and/or transmission wired or wireless communications via wired and/or wireless transceivers, including those making use of an audio jack/plug, a microphone jack/plug, a universal serial bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof.

Communication interface 540 may also include one or more Global Navigation Satellite System (GNSS) receivers or transceivers that are used to determine a location of the computing system 500 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 530 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (L1/L2/L3/L4/L5/L #), resistive random-access memory (RRAM/ReRAM), phase change memory (PCM), spin transfer torque RAM (STT-RAM), another memory chip or cartridge, and/or a combination thereof.

Storage device 530 can include software services, servers, services, etc., that when the code that defines such software is executed by the processor 510, it causes the system to perform a function. In some embodiments, a hardware service that performs a particular function can include the software component stored in a computer-readable medium in connection with the necessary hardware components, such as processor 510, connection 505, output device 535, etc., to carry out the function.

As understood by those of skill in the art, machine-learning based classification techniques can vary depending on the desired implementation. For example, machine-learning classification schemes can utilize one or more of the following, alone or in combination: hidden Markov models; recurrent neural networks; convolutional neural networks (CNNs); deep learning; Bayesian symbolic methods; general adversarial networks (GANs); support vector machines; image registration methods; applicable rule-based system. Where regression algorithms are used, they may include including but are not limited to: a Stochastic Gradient Descent Regressor, and/or a Passive Aggressive Regressor, etc.

Machine learning classification models can also be based on clustering algorithms (e.g., a Mini-batch K-means clustering algorithm), a recommendation algorithm (e.g., a Mini-wise Hashing algorithm, or Euclidean Locality-Sensitive Hashing (LSH) algorithm), and/or an anomaly detection algorithm, such as a Local outlier factor. Additionally, machine-learning models can employ a dimensionality reduction approach, such as, one or more of: a Mini-batch Dictionary Learning algorithm, an Incremental Principal Component Analysis (PCA) algorithm, a Latent Dirichlet Allocation algorithm, and/or a Mini-batch K-means algorithm, etc.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

As noted above, an AV such as AV 402 can have trained machine learning models deployed to automatically assign influence scores to each detected object. One example of such network is described next.

Figure 6:
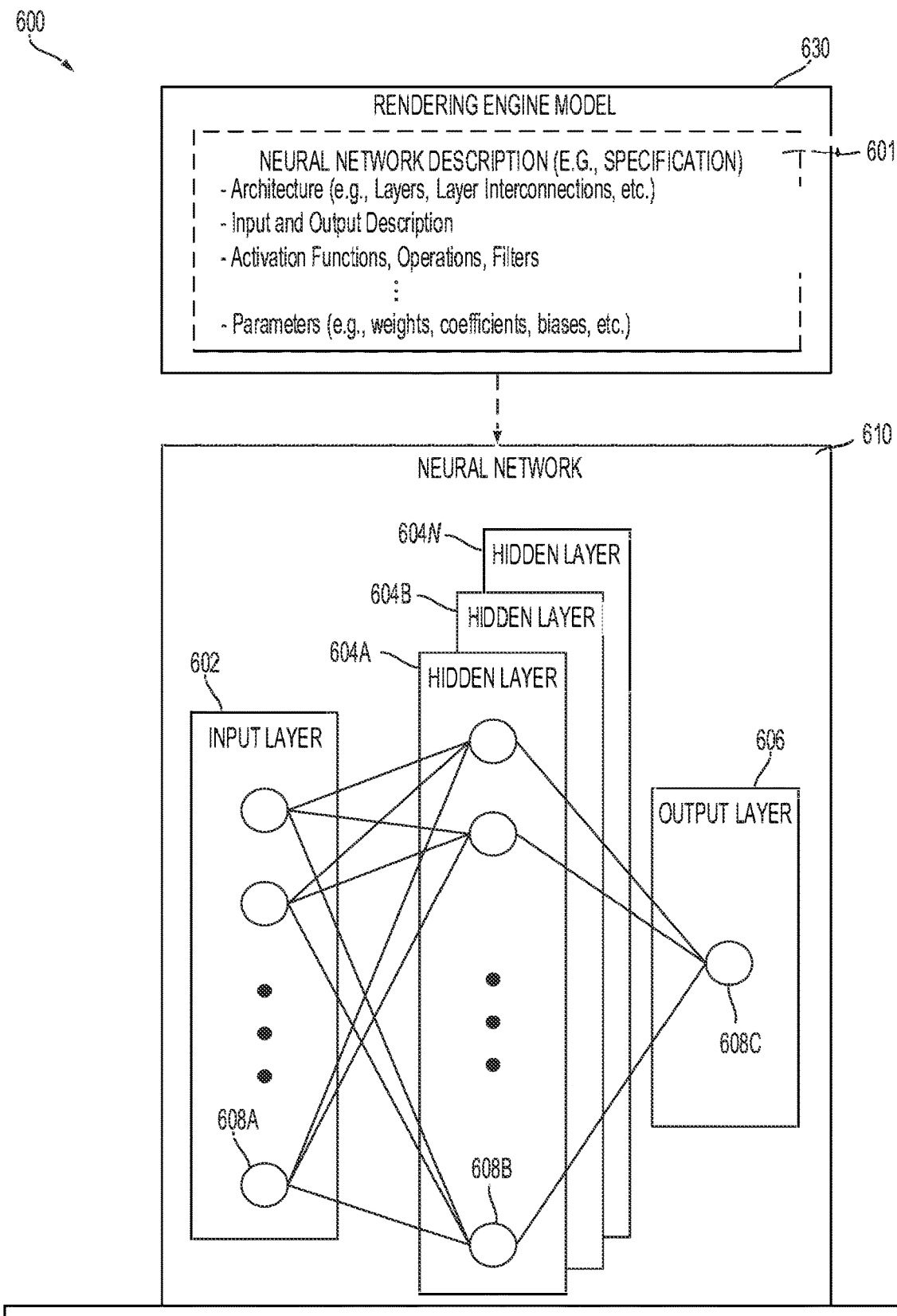
FIG. 6 illustrates an example neural network architecture, in accordance with some aspects of the present technology.

FIG. 6 illustrates an example neural network architecture, in accordance with some aspects of the present technology. Architecture 600 includes a neural network 610 defined by an example neural network description 601 in rendering engine model (neural controller) 630. The neural network 610 can represent a neural network implementation of a rendering engine for rendering media data. The neural network description 601 can include a full specification of the neural network 610, including the neural network architecture 600. For example, the neural network description 601 can include a description or specification of the architecture 600 of the neural network 610 (e.g., the layers, layer interconnections, number of nodes in each layer, etc.); an input and output description which indicates how the input and output are formed or processed; an indication of the activation functions in the neural network, the operations or filters in the neural network, etc.; neural network parameters such as weights, biases, etc.; and so forth.

The neural network 610 reflects the architecture 600 defined in the neural network description 601. In this example, the neural network 610 includes an input layer 602, which includes input data, information about objects in an environment as perceived by sensors (e.g., sensors 404, 406, and/or 408 of the AV 402). In one illustrative example, the input layer 602 can include data representing a portion of the input media data such as a patch of data or pixels (e.g., a 128×128 patch of data) in an image corresponding to the input media data (e.g., that of AV 402 and the environment). Additional input data, for purposes of determining a corresponding influence score for each object include, but are not limited to, direction of movement of the object, speed of the object, acceleration of the object, type of the object, etc.

The neural network 610 includes hidden layers 604A through 604N (collectively "604" hereinafter). The hidden layers 604 can include n number of hidden layers, where n is an integer greater than or equal to one. The number of hidden layers can include as many layers as needed for a desired processing outcome and/or rendering intent. The neural network 610 further includes an output layer 606 that provides an output (e.g., influence scores) resulting from the processing performed by the hidden layers 604. In one illustrative example, the output layer 606 can provide a corresponding influence score for each object detected by sensors 404, 406, and/or 408.

The neural network 610 in this example is a multi-layer neural network of interconnected nodes. Each node can represent a piece of information. Information associated with the nodes is shared among the different layers and each layer retains information as information is processed. In some cases, the neural network 610 can include a feedforward neural network, in which case there are no feedback connections where outputs of the neural network are fed back into itself. In other cases, the neural network 610 can include a recurrent neural network, which can have loops that allow information to be carried across nodes while reading in input.

Information can be exchanged between nodes through node-to-node interconnections between the various layers. Nodes of the input layer 602 can activate a set of nodes in the first hidden layer 604A. For example, as shown, each of the input nodes of the input layer 602 is connected to each of the nodes of the first hidden layer 604A. The nodes of the hidden layer 604A can transform the information of each input node by applying activation functions to the information. The information derived from the transformation can then be passed to and can activate the nodes of the next hidden layer (e.g., 604B), which can perform their own designated functions. Example functions include convolutional, up-sampling, data transformation, pooling, and/or any other suitable functions. The output of the hidden layer (e.g., 604B) can then activate nodes of the next hidden layer (e.g., 604N), and so on. The output of the last hidden layer can activate one or more nodes of the output layer 606, at which point an output is provided. In some cases, while nodes (e.g., nodes 608A, 608B, 608C) in the neural network 610 are shown as having multiple output lines, a node has a single output and all lines shown as being output from a node represent the same output value.

In some cases, each node or interconnection between nodes can have a weight that is a set of parameters derived from training the neural network 610. For example, an interconnection between nodes can represent a piece of information learned about the interconnected nodes. The interconnection can have a numeric weight that can be tuned (e.g., based on a training dataset), allowing the neural network 610 to be adaptive to inputs and able to learn as more data is processed.

The neural network 610 can be pre-trained to process the features from the data in the input layer 602 using the different hidden layers 604 in order to provide the output through the output layer 606. In an example in which the neural network 610 is used to determine an influence score for detected objects, the neural network 610 can be trained using training data that includes example objects in an environment as perceived by sensors 104-108 of an AV. For instance, training images can be input into the neural network 610, which can be processed by the neural network 610 to generate outputs which can be used to tune one or more aspects of the neural network 610, such as weights, biases, etc.

In some cases, the neural network 610 can adjust weights of nodes using a training process called backpropagation. Backpropagation can include a forward pass, a loss function, a backward pass, and a weight update. The forward pass, loss function, backward pass, and parameter update is performed for one training iteration. The process can be repeated for a certain number of iterations for each set of training media data until the weights of the layers are accurately tuned.

For a first training iteration for the neural network 610, the output can include values that do not give preference to any particular class due to the weights being randomly selected at initialization. For example, if the output is a vector with probabilities that the object includes different product(s) and/or different users, the probability value for each of the different product and/or user may be equal or at least very similar (e.g., for ten possible products or users, each class may have a probability value of 0.1). With the initial weights, the neural network 610 is unable to determine low level features and thus cannot make an accurate determination of what the classification of the object might be. A loss function can be used to analyze errors in the output. Any suitable loss function definition can be used.

The loss (or error) can be high for the first training dataset (e.g., images) since the actual values will be different than the predicted output. The goal of training is to minimize the amount of loss so that the predicted output comports with a target or ideal output. The neural network 610 can perform a backward pass by determining which inputs (weights) most contributed to the loss of the neural network 610, and can adjust the weights so that the loss decreases and is eventually minimized.

A derivative of the loss with respect to the weights can be computed to determine the weights that contributed most to the loss of the neural network 610. After the derivative is computed, a weight update can be performed by updating the weights of the filters. For example, the weights can be updated so that they change in the opposite direction of the gradient. A learning rate can be set to any suitable value, with a high learning rate including larger weight updates and a lower value indicating smaller weight updates.

The neural network 610 can include any suitable neural or deep learning network. One example includes a convolutional neural network (CNN), which includes an input layer and an output layer, with multiple hidden layers between the input and out layers. The hidden layers of a CNN include a series of convolutional, nonlinear, pooling (for downsampling), and fully connected layers. In other examples, the neural network 610 can represent any other neural or deep learning network, such as an autoencoder, a deep belief nets (DBNs), a recurrent neural networks (RNNs), etc.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

What is claimed is:

1. A computer-implemented method for generating a synthetic map, comprising:
    collecting sensor data, by an autonomous vehicle stack of an autonomous vehicle, corresponding with a three-dimensional (3D) space surrounding the autonomous vehicle as the autonomous vehicle navigates the 3D space;
    identifying a set of identified objects in the sensor data;
    determining, by the autonomous vehicle stack that controls operation of the autonomous vehicle as the autonomous vehicle navigates the 3D space, (1) a corresponding influence score for each object in the set of identified objects, which indicates a likelihood that the object influences a trajectory of the autonomous vehicle at a present time and (2) a corresponding duration of presence of each object in the set of identified objects in the sensor data;
    selecting one or more objects in the set of identified objects for inclusion in the synthetic map based on the determined influence scores for each object in the set of identified objects and the determined duration of presence of each object in the set of the identified objects, wherein when the corresponding influence score of an object in the set of identified objects is greater than a first threshold and the corresponding duration of presence of the object in the set of identified object is greater than a second threshold, then the object is selected for inclusion in the synthetic map; and generating the synthetic map including a 3D rendering of the selected one or more objects.

2. The computer-implemented method of claim 1, wherein the sensor data comprises Light Detection and Ranging (LiDAR) sensor data collected by an autonomous vehicle (AV).

3. The computer-implemented method of claim 2, wherein the sensor data comprises Light Detection and Ranging (LiDAR) sensor data associated with one or more roadways and the set of identified objects are detected therein while the AV passed through the one or more roadways.

4. The computer-implemented method of claim 1, wherein the influence score for an object in the set of identified objects is directly proportional to a probability of the object interfering with a trajectory of the autonomous vehicle (AV).

5. The computer-implemented method of claim 1, wherein the set of identified objects comprises one or more of: buildings, cross walks, traffic lights, stop signs, and other objects on roads or sidewalks.

6. The computer-implemented method of claim 1, further comprising:
simulating a drive of a simulated autonomous vehicle (AV) through at least a portion the synthetic map, the portion of the map including the selected one or more objects.

7. The computer-implemented method of claim 6, further comprising:
updating the autonomous vehicle stack of the autonomous vehicle developed for operating the autonomous vehicle based on results of simulating the drive of the simulated AV.

8. A system, comprising:
one or more non-transitory computer-readable media comprising computer-readable instructions; and
one or more processors configured to execute the computer-readable instructions to:
collect, by an autonomous vehicle stack of an autonomous vehicle, sensor data corresponding with a three-dimensional (3D) space surrounding the autonomous vehicle as the autonomous vehicle navigates the 3D space;
identify a set of identified objects in the sensor data;
determine, by the autonomous vehicle stack that controls operation of the autonomous vehicle as the autonomous vehicle navigates the 3D space, (1) a corresponding influence score for each object in the set of identified objects, which indicates a likelihood that the object influences a trajectory of the autonomous vehicle at a present time and (2) a corresponding duration of presence of each object in the set of identified objects in the sensor data;
select one or more objects in the set of identified objects for inclusion in the synthetic map based on the determined influence scores for each object in the set of identified objects and the determined duration of presence of each object in the set of the identified objects, wherein when the corresponding influence score of an object in the set of identified objects is greater than a first threshold and the corresponding duration of presence of the object in the set of identified object is greater than a second threshold, then the object is selected for inclusion in the synthetic map; and
generate the synthetic map including a 3D rendering of the selected one or more objects selected.

9. The system of claim 8, wherein the sensor data comprises Light Detection and Ranging (LiDAR) sensor data collected by the autonomous vehicle (AV).

10. The system of claim 9, wherein the sensor data comprises Light Detection and Ranging (LiDAR) sensor data associated with one or more roadways and the set of identified objects are detected therein while the AV passed through the one or more roadways.

11. The system of claim 8, wherein the influence score for an object in the set of identified objects is directly proportional to a probability of the object interfering with a trajectory of the autonomous vehicle (AV).

12. The system of claim 8, wherein the set of identified objects comprises one or more of: buildings, cross walks, traffic lights, stop signs, and other objects on roads, or sidewalks.

13. The system of claim 8, wherein the one or more processors are configured to execute the computer-readable instructions to simulate a drive of a virtual autonomous vehicle (AV) through at least a portion the synthetic map, the portion of the map including the selected one or more objects.

14. The system of claim 13, wherein the one or more processors are configured to execute the computer-readable instructions to update the autonomous vehicle stack of the autonomous vehicle developed for operating the autonomous vehicle based on results of simulating the drive of the simulated AV.

15. One or more non-transitory computer-readable media comprising computer-readable instructions, which when executed by one or more processors, cause the one or more processors to:
collect, by an autonomous vehicle stack of an autonomous vehicle, sensor data corresponding with a three-dimensional (3D) space surrounding the autonomous vehicle as the autonomous vehicle navigates the 3D space;
identify a set of identified objects in the sensor data;
determine, by the autonomous vehicle stack that controls operation of the autonomous vehicle as the autonomous vehicle navigates the 3D space, (1) a corresponding influence score for each object in the set of identified objects, which indicates a likelihood that the object influences a trajectory of the autonomous vehicle at a present time and (2) a corresponding duration of presence of each object in the set of identified objects in the sensor data;
select one or more objects in the set of identified objects for inclusion in the synthetic map based on the determined influence scores for each object in the set of identified objects and the determined duration of presence of each object in the set of the identified objects, wherein when the corresponding influence score of an object in the set of identified objects is greater than a first threshold and the corresponding duration of presence of the object in the set of identified object is greater than a second threshold, then the object is selected for inclusion in the synthetic map; and
generate the synthetic map including a 3D rendering of the selected one or more objects selected.

16. The one or more non-transitory computer-readable media of claim 15, wherein the sensor data comprises Light Detection and Ranging (LiDAR) sensor data collected by the autonomous vehicle (AV).

17. The one or more non-transitory computer-readable media of claim 16, wherein the sensor data comprises Light Detection and Ranging (LiDAR) sensor data associated with one or more roadways and the set of identified objects are detected therein while the AV passed through the one or more roadways.

18. The one or more non-transitory computer-readable media of claim 15, wherein the influence score for an object in the set of identified objects is directly proportional to a probability of the object interfering with a trajectory of the autonomous vehicle (AV).

19. The one or more non-transitory computer-readable media of claim 15, wherein the set of identified objects comprises one or more of: buildings, cross walks, traffic lights, stop signs, and other objects on roads, or sidewalks.

20. The one or more non-transitory computer-readable media of claim 15, wherein the execution of the computer-readable instructions by the one or more processors further cause the one or more processors to simulate a drive of a virtual autonomous vehicle (AV) through at least a portion the synthetic map, the portion of the map including the selected one or more objects.

* * * * *